United States Patent [19]

Smith et al.

[11] 4,340,305
[45] * Jul. 20, 1982

[54] PLATE ALIGNING

[75] Inventors: Henry I. Smith, Sudbury, Mass.; Stewart S. Austin, Marlboro, N.J.; Dale C. Flanders, Lexington, Mass.

[73] Assignee: Massachusetts Institute of Technology, Cambridge, Mass.

[ * ] Notice: The portion of the term of this patent subsequent to Apr. 29, 1997, has been disclaimed.

[21] Appl. No.: 106,842

[22] Filed: Dec. 26, 1979

Related U.S. Application Data

[63] Continuation-in-part of Ser. No. 793,259, May 3, 1977, Pat. No. 4,200,395.

[51] Int. Cl.³ ............................................. G01B 11/26
[52] U.S. Cl. .................................................... 356/356

[58] Field of Search ............... 356/354, 356, 138, 374; 250/231 SE

[56] References Cited

U.S. PATENT DOCUMENTS 4,200,395 4/1980 Smith et al. ......................... 356/356

Primary Examiner—John K. Corbin
Assistant Examiner—Bruce Y. Arnold
Attorney, Agent, or Firm—Arthur A. Smith, Jr.; Charles Hieken

[57] ABSTRACT

First and second plates are formed with like periodic patterns. A laser beam illuminates the second plate through the alignment marks of the first plate to provide a pair of diffracted beams that are detected with alignment being indicated when the beams are of the same intensity.

3 Claims, 23 Drawing Figures

PLATE ALIGNING

The invention described herein was made in the course of work performed under Contract Number F19628-76-C-0002 with the Department of the Air Force, Electronic Systems Division.

REFERENCE TO PRIOR COPENDING APPLICATION

This application is a continuation-in-part of copending application Ser. No. 793,259 filed May 3, 1977 now U.S. Pat. No. 4,200,395.

BACKGROUND OF THE INVENTION

This invention relates in general to aligning objects and more particularly to superimposing alignment marks, as well as other patterns, on two or more plates. The term plate includes masks, such as photomasks and X-ray lithography masks, reticles, wafers, substrates and other solid, generally flat, objects.

In many microlithographic techniques such as photolithography, and X-ray lithography (see soft X-ray lithographic apparatus and process, Smith et al., U.S. Pat. No. 3,743,842, July 3, 1973) it is frequently desirable to expose several separate masks on the same substrate, and the patterns produced by these several masks (the "primary patterns") must be precisely superimposed. One method of achieving this is to place on each of the several masks of a set, alignment marks having spatial relationships to the primary patterns that are exactly the same on each mask. Thereafter, superposing of the mask's alignment marks relative to corresponding alignment marks on the substrate ensures superposition of primary patterns on the substrate. In many cases, extensive processing of a substrate, such as doping, high temperature baking, and other steps, occurs between each exposure, and it is important that the substrate alignment marks neither be destroyed nor lead to contamination or alteration of the substrate or to processing problems. If the minimum feature size of patterns to be exposed on a substrate is of the order of 2.5 micrometer ($\mu m$), superposition precision of the order of 0.5 $\mu m$ is often adequate. In such cases, ordinary optical imaging techniques can be used. Alignment is achieved by superimposing two or more mask alignment marks (typically in the form of an L or a T) over similar alignment marks on a substrate. Both rotational and translational alignment is achieved by viewing the two sets of alignment marks through a microscope. With this technique it is difficult to simultaneously view with high resolution an alignment mark on the mask and one on the substrate when there is a finite separation or gap between said alignment marks. This is because the depth of focus of high resolution lenses is severely limited. Moreover, the technique is inadequate for superposition precisions of 100 nanometers (nm) and below, which will be required by the new microlithographic techniques of X-ray lithography, conformable photomask lithography and far UV lithography (see B. J. Lin, Deep UV Conformable-Contact Photolithography for Bubble Circuits, IBM Journal, p. 213, May 1976). These techniques are capable of exposing patterns with minimum feature sizes below 1 $\mu m$ and thus require correspondingly improved superposition precision, superior to that provided by the conventional optical imaging techniques referred to above.

A soft X-ray mask alignment system (see "Soft X-Ray Mark Alignment System", Smith et al., U.S. Pat. No. 3,742,229) has been patented that is based on the detection of soft X-rays transmitted through matching alignment marks on an X-ray mask and a substrate. A disadvantage of this system is the requirement that the substrate be transparent to soft X-rays in the region behind the alignment marks on the substrate so that X-rays can pass through the substrate to a soft X-ray sensor. This requires either a thinning of the substrate in these regions or, in some cases, the drilling of holes entirely through the substrate. Another soft X-ray mask alignment scheme (see "Soft X-ray Mask Alignment System", H. I. Smith, U.S. Pat. No. 3,984,860) has also been patented that is based on the detection of soft X-rays or other radiation emitted by fluorescent material on the substrate. These X-rays are detected by means of a detector located away from the substrate in the direction of the mask. Disadvantages of this system include poor signal-to-noise ratio and possible contamination of the substrate by the material of the substrate alignment mark.

M. C. King and D. H. Berry proposed an alignment scheme that is superior in performance to conventional optical imaging techniques (see M. C. King, U.S. Pat. No. 3,690,881). The alignment marks on the mask and the substrate consist of concentric circles, those on the mask having slightly different pitch than those on the substrate. Superposition is achieved by viewing the moire pattern formed when the mask alignment marks are placed above the substrate alignment marks. At misalignment, a cusp-like moiré fringe pattern is formed. At perfect superposition, the moire pattern is a set of concentric fringes centered over the image of the alignment marks. King and Berry claimed a superposition precision of 200 nm (M. C. King and D. H. Berry, Applied Optics, Vol. 11, page 2455 et seq. 1972). A difficulty with this scheme is that maximum moire fringe contrast is achieved when imaging is done in an optical system of low numerical aperture, a requirement that is inconsistent with the need to image the gratings themselves. Also, the scheme is not compatible with large mask-to-substrate separations. An additional problem is that the concentric circle alignment marks required by this scheme are difficult or costly to generate by conventional pattern generation means. Also, because of the complexity of the moiré fringe pattern, it is difficult to implement an automatic mask alignment system based on this scheme.

It is therefore an object of this invention to provide an alignment system for superimposing alignment marks on two or more plates (defined here to include photomasks, X-ray lithography masks, other masks, reticles, wafers, substrates and other solid, generally flat objects) and capable of submicrometer superposition precision.

It is a further object of this invention to provide an alignment system that will function properly when the separation distance between two or more of the plates to be superimposed exceeds several micrometers.

It is a further object of this invention to provide a means for superimposing alignment marks on two or more plates when one plate may be opaque to the radiation used for alignment.

It is a further object of this invention to provide for the superposition of the alignment marks of each of a set of plates relative to the alignment marks on a single plate.

It is a further object of this invention to provide a means of determining the separation distance between facing alignment marks.

It is a further object of this invention to achieve one or more of the preceding objects using alignment marks on a plate that are non-contaminating to said plate.

It is a further object of this invention to achieve one or more of the preceding objects using alignment marks that have a geometrically simple pattern that can be readily generated by conventional pattern generation means.

It is a further object of this invention to achieve one or more of the preceding objects in an automated alignment system.

SUMMARY OF THE INVENTION

According to the invention, intentionally create on a first plate one or more alignment marks and on a second plate (or additional plates) create corresponding alignment marks of the same or similar pattern as on the first, thereafter pass a beam of electromagnetic or other short wavelength radiation through alignment marks on the first plate and either through or in reflection from alignment marks on the second or additional plate, thereafter to detect the radiation diffracted from the alignment marks located in front of (i.e., "facing") one another and determine from the intensity (and/or the intensity's dependence on lateral position) of the radiation diffracted into a given direction the superposition or lack of superposition of the facing alignment marks and to use this information as the basis for moving one or more of the plates so that the facing alignment marks are precisely superimposed.

This invention is based on the discovery that the superposition of alignment marks or two or more plates can be determined by viewing and/or measuring the radiation diffracted by the alignment marks. Moreover, in those cases where single alignment marks diffract electromagnetic radiation into positive and negative directions (positive and negative directions are defined as directions clockwise and counterclockwise respectively from the direction of an incident beam) with equal intensity (i.e., bilateral symmetry), such as occurs for example with non-blazed gratings, the superposition of such alignment marks on two or more plates also corresponds to bilateral symmetry in the diffracted beams. Thus, superposition can be readily detected and automated by seeking the condition of intensity balance in beams symmetrically diffracted by two or more facing alignment marks.

This invention differs substantially from applications of moire effects. Firstly, it is a non-imaging technique, that is, lenses or imaging optics are not an essential part of the invention's means for determining superposition. Secondly, the several beams that make up a group (defined below in preferred embodiment), such as the $+1$ group, interfere with one another and thus the invention is in fact a new kind of interferometer. Thirdly, an important aspect of the invention is based on comparing the $+1$ group with the $-1$ group, the $+2$ group with the $-2$ group and so forth as necessary.

Numerous other features, objects and advantages of the invention will become apparent from the following specification when read in connection with the accompanying drawing in which:

DETAILED DESCRIPTION OF PREFERRED EMBODIMENTS

Figure 1:
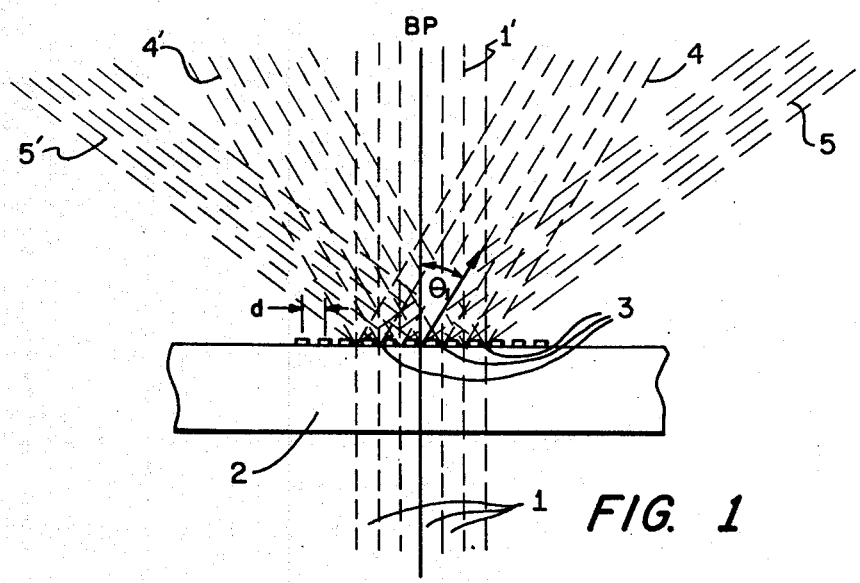
FIG. 1 illustrates the phenomenon of diffraction from a periodic grating.

With reference now to the drawing and more particularly FIG. 1, there is illustrated the phenomenon of diffraction from a periodic grating. A beam of electromagnetic radiation 1 is incident on a plate 2 having on its surface a grating 3 whose lines run perpendicular into the page. Said grating periodically alters either the phase and/or the amplitude of the electromagnetic radiation 1 as it passes through the grating. Some of the incident radiation passes undeviated in the forward direction forming the so-called zero order beam 1'. Another fraction of the radiation is diffracted by the grating forming the pairs of beams 4 and 4', 5 and 5' etc. Diffracted beams also occur in the backward direction, but these are not depicted in FIG. 1. The angles of the diffracted beams are given by the equation $$n\lambda/d = \sin\theta_n - \sin\theta_i, \qquad \text{Kq. 1}$$

where $\theta_i$ is the angle that the incident beam 1 makes with the normal to the surface of plate 2, d is the spatial period or repeat distance of the grating, $\lambda$ is the wavelength of the electromagnetic radiation and $n=0, \pm1, \pm2$ etc. The first pair of diffracted beams 4 and 4' correspond to $n=+1$ and $n=-1$ respectively and are called the $+$ and $-$ first order diffracted beams respectively. The second pair, 5 and 5', correspond to $n=+2$ and $n=-2$ and are called the $+$ and $-$ second order diffracted beams respectively. An analogous nomenclature obtains for $|n|>2$. Note that if $\theta_i=0$, $|\theta_{+n}|=|\theta_{-n}|$, that is, pairs of diffracted beams are symmetrical in angle with respect to the surface normal. It is well-known that if the grating 3 is non-blazed, that is, if the cross-sectional structure of the grating in FIG. 1 is identical to the cross-sectional structure when the grating is rotated in its plane by 180°, then the intensities of any pair of symmetrically diffracted beams, $+n$ and $-n$, are equal and thus the entire diffraction phenomenon is symmetrical about a bisecting plane indicated by BP in FIG. 1.

Figure 2:
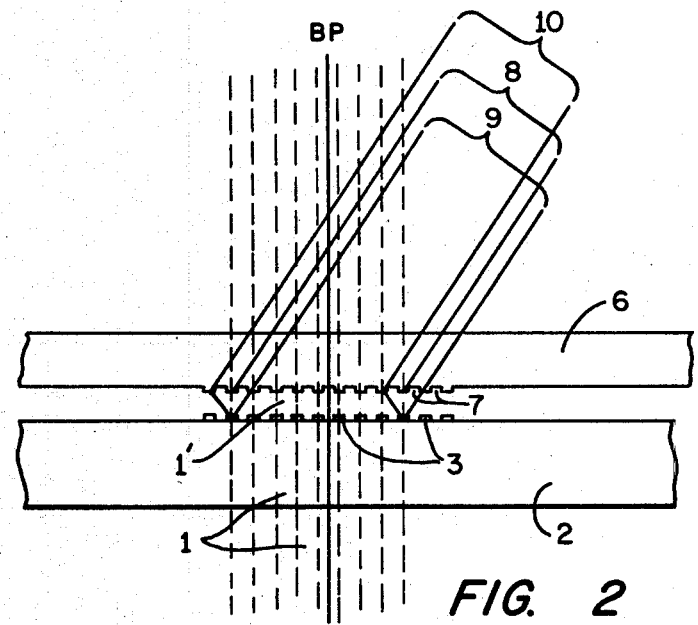
FIG. 2 shows a pair of spaced plates to illustrate the phenomena of double diffration.

Referring to FIG. 2, there is shown a second plate 6 having a grating 7 placed above the first plate 2. This second grating leads to so-called double diffraction phenomena. An example is depicted in FIG. 2. The zero order beam 1' emerging from plate 2 can be partly diffracted by grating 7 into the $+1$ order, as indicated by 3. Part of the $+1$ order beam diffracted by plate 2 can pass through grating 7 undiffracted as indicated by 9. The $-1$ order beam diffracted from grating 3 can be partly diffracted into the $+2$ order by grating 7 as indicated by 10. In this same manner a number of similar beams can be formed. If gratings 3 and 7 have the same spatial period and their lines are parallel, beams 8, 9 and 10 propagate in the same direction and interfere with one another where they overlap. In addition to the three constituent beams 8, 9 and 10 indicated in FIG. 2, a number of other doubly diffracted beams also propagate in the same direction as 8, 9 and 10, and these can be identified in the manner indicated above. The intensities of the various constituent beams that make up a group generally fall off the higher the order of diffraction involved in beam formation. The common direction of beams 8, 9 and 10 is given by equation 1 and for this reason the group of beams having the same or nearly the same direction as that predicted by equation 1 for $n=+1$ is called the $+1$ group. A $-1$ group is also formed in a manner similar to that described for the $+1$ group, but for the sake of clarity the $-1$ group is omitted from FIG. 2. For this same reason the $+2$ and $-2$, $+3$ and $-3$, and so forth groups, and all back diffracted groups are also not indicated.

The intensity of the $+1$ group or any other group in the region where several constituent beams overlap depends on the mutual interference of these several beams. This in turn depends on the relative lateral positions of gratings 3 and 7 (where the term lateral implies a direction perpendicular to the lines of a grating and in the plane of a grating) as well as the parallelism of gratings 3 and 7 and the parallelism of plates 2 and 6. In any practical implementation of this invention plates 2 and 6 would usually first be made parallel and then kept parallel during subsequent alignment. If plates 2 and 6 are parallel but the stripes of gratings 3 and 7 are slightly non-parallel, beams 8, 9 and 10, and any other constituent beams, propagate in slightly different directions and their mutual interference causes fringes to appear across the diameter of the group. This phenomenon is described by J. Guild, in the book "Diffraction Gratings as Measuring Scales," (Oxford University, London, 1960). In the practice of this invention, gratings 3 and 7 can be made parallel to within an angle less than d/nl radians (where d is the grating period, n is the group number, and l is the length of the grating stripes illuminated by the beam 1) by viewing the fringes across the n'th group diameter and rotating grating 3 and/or 7 until said fringes disappear, that is, their spacing is larger than the group diameter. This ability to adjust the angle between gratings 3 and 7 is an important feature of this invention.

Non-parallelism of plates 2 and 6 can cause assymmetry in the direction and intensity of $+$ and $-$ groups. Non-parallelism is readily observed in practice since in such a case the passage of beam 1 through plates 2 and 6 and any multiple reflections between said plates leads to transmission interference fringes ("air wedge interference fringes") that are readily observed in either the forward or back direction. One need only to adjust the angles between said plates until the air wedge interference fringes are sufficiently well separated.

Figure 3A:
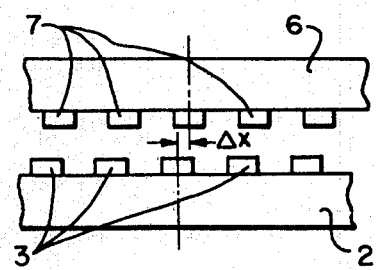
FIGS. 3A and 3B illustrate conditions of misalignment and alignment, respectively, of the spaced plates shown in FIG. 2.
Figure 3B:
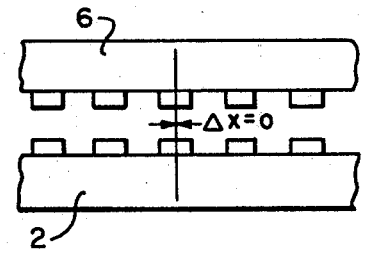

Referring to FIG. 3A, there is illustrated the condition of misalignment or non-superposition which corresponds to the case where the relative lateral displacement, $\Delta X$, of gratings 3 and 7 is non-zero. FIG. 3B illustrates the condition of alignment or superposition, corresponding to $\Delta X = 0$. One aspect of this invention is that if gratings 3 and 7 are non-biased the relative phases of the several beams that make up or constitute a particular $+$ group (such as $+1$, $+2$, etc.), and hence the intensity of that group, will be identical to the relative phases of the several beams that make up the corresponding-group only when grating 7 is exactly superimposed over grating 3 (i.e., $\Delta X = 0$). Stated more simply, the intensities of the diffracted groups will be symmetrical about the bisecting plane indicated in FIG. 2 only when grating 7 is superimposed over grating 3 (assuming gratings 3 and 7 are non-blazed). The intensities of the diffracted groups change as gratings 3 and 7 are moved relative to one another in a lateral direction, and these changes repeat (i.e. cycle) for relative lateral displacements that are integral multiples of the grating period, d (i.e., $|\Delta X| = md$, where m is an integer). In those cases where it is desired to superimpose a particular part of one alignment mark over a particular part of another alignment mark, a method of preliminary alignment to within less than d/2 may be employed. For example, conventional optical imaging techniques could be used for preliminary alignment. After such preliminary alignment, the above described method according to the invention of achieving symmetry in the intensities of diffracted groups can then be used to achieve exact superposition. Alternatively, instead of using alignment marks whose patterns are only regular periodic gratings (so called "patterns invariant to translations of d") one could choose an alignment mark pattern lacking such translational invarience, but which otherwise diffracted electromagnetic radiation into $+$ and $-$ orders in the same or similar manner as regular periodic gratings.

Figure 4A:
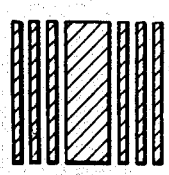
FIGS. 4A–4E illustrate a number of patterns that include diffraction gratings with a feature for uniquely defining alignment.
Figure 4B:
Figure 4C:
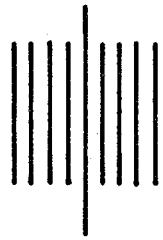
Figure 4D:
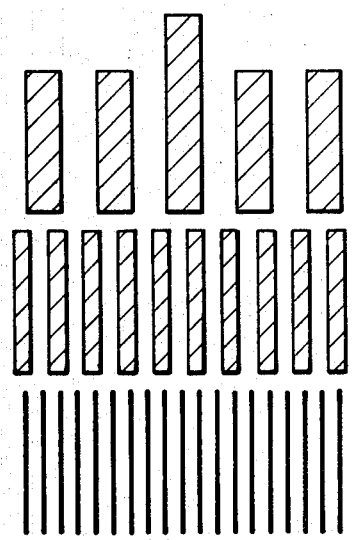
Figure 4E:
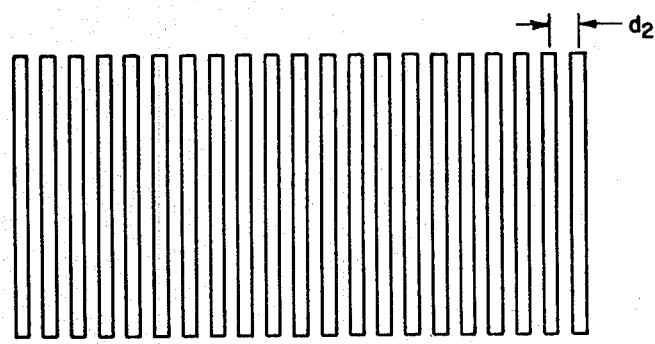
Figure 4E:
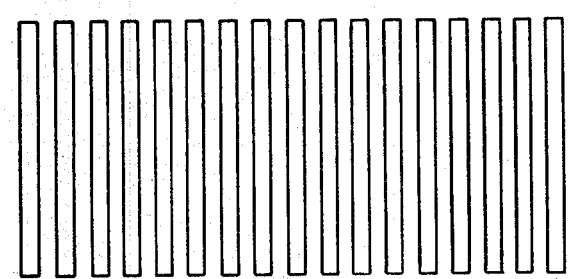
Figure 5:
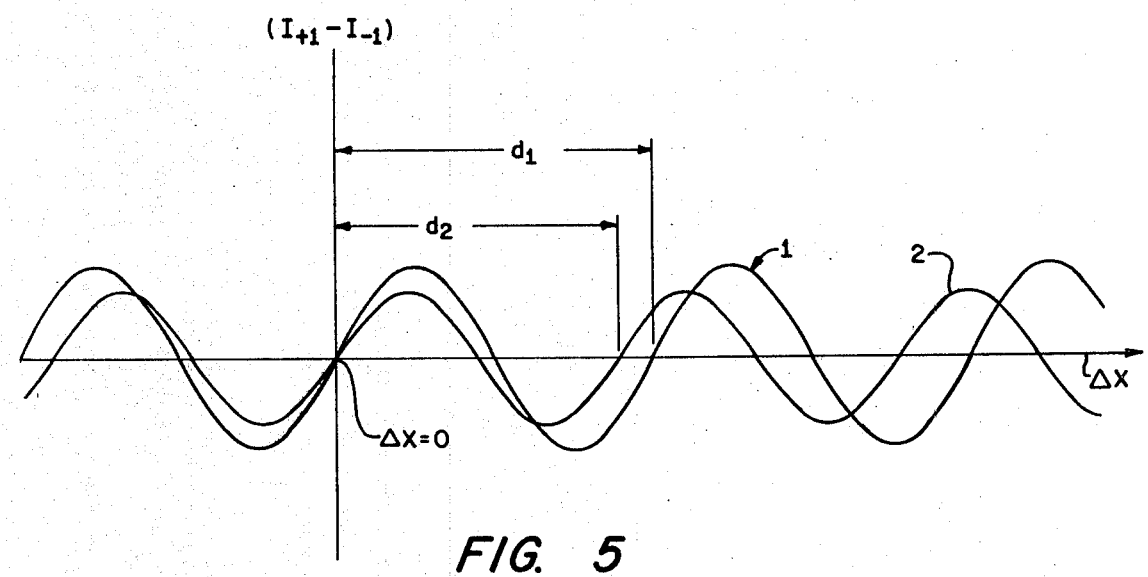
FIG. 5 is a graphical representation of first order differential intensities as a function of displacement.

Referring to FIGS. 4A–4E, there are illustrated a few of such patterns. FIGS. 4A–4D show aperiodic markings that may be preliminarily aligned with conventional optical imaging techniques as described above. FIG. 4E illustrates a special case where the alignment mark consists of two gratings of slightly different spatial periods. Consider the case where such an alignment mark on one plate is placed above and parallel to a matching alignment mark on a second plate such that gratings of the same spatial period face one another. When a beam of electromagnetic radiation (or separate beams for each pair of facing gratings) is incident on the alignment marks, each pair of facing gratings will give rise to a set of diffracted groups. The facing gratings of smaller spatial period will diffract groups to slightly larger angles than will the facing gratings of larger spatial period. As discussed above, when gratings are displaced laterally relative to one another, the intensities of diffracted groups cycle as a function of displacement distance at a period equal to the grating period. Since the two pairs of facing gratings have slightly different spatial periods, diffracted groups from one pair will cycle at a slightly different period than diffracted groups from the other pair. Suppose, for example, that facing alignment marks consist of two gratings of spatial periods $d_1$ and $d_2$ ($d_1 > d_2$). The difference in intensity between a $+1$ diffracted group and a $-1$ diffracted group will cycle as a function of displacement ($\Delta X$) with the period $d_1$ for one of the grating pairs, and with the period $d_2$ for the other pair of gratings. This is illustrated in FIG. 5, where the curve marked 1 is for the pair of gratings of period $d_1$ and the curve marked 2 is for the pair of gratings of period $d_2$. In practice these curves while periodic, may be other than purely sinusoidal. The points where a curve crosses the abscissa correspond to intensity balance between the $+1$ and the $-1$ groups and thus if the gratings are non-blazed correspond to superposition of facing stripes for that pair of gratings. At the origin indicated by $\Delta X = 0$ in FIG. 5, the stripes of both pairs of facing gratings are simultaneously superimposed, curves 1 and 2 are substantially in phase and cross the abscissa. FIG. 5 also shows that as $\Delta X$ is increased above $\Delta X = 0$ or decreased below $\Delta X_c = 0$, there is a progressive increase in the absolute value of phase difference between curves 1 and 2. The distance along the abscissa at which this phase difference repeats is called the "beat distance" and is give by $d_1 d_2/(d_1 - d_2)$. By proper choice of the ratio $d_1/d_2$, the beat distance can be made either an integral multiple of $d_1$ (and hence also an integral multiple of $d_2$) or a non-integral multiple of $d_1$. In the former case, the beat distance from $\Delta X = 0$ in FIG. 5 would also be a point where both curve 1 and curve 2 crossed the abscissa. In the latter case, curves 1 and 2 would be in phase with one another at the best distance from $\Delta X = 0$, but they would not be crossing the abscissa at that point. These facts can be used to choose the periods $d_1$ and $d_2$, and the lateral length (i.e. the length perpendicular to the grating stripes) of the two gratings that comprise an alignment mark such that there is only one position, namely $\Delta X = 0$, at which facing stripes of both gratings are simultaneously superimposed. This position may be defined as the position of "unique superposition".

The use of alignment marks composed of two (or more) gratings of different periods, such as described above, provides a means of repeatable superposition even if the alignment marks of one or both of a pair of plates are blazed. In such a case, superposition would correspond to a generalization of the situation depicted in FIG. 5. Curves 1 and 2 would be substantially in phase at superposition ($\Delta X = 0$), but they would not in general be crossing the abscissa. Thus, by looking for the condition where curves 1 and 2 are substantially in phase, one can achieve alignment mark superposition (i.e., $\Delta X = 0$) even if the gratings of one or both of a pair of plates are blazed. In practice, it is preferred that the beat length be chosen so that the in-phase condition occurs only at superposition ($\Delta X = 0$).

For alignment marks having the values of $d_1$ and $d_2$ such that there is a position of unique superposition, the phase difference between curves 1 and 2 uniquely defines the value of $\Delta X$. That is, from this phase difference one can determine how far away from unique superposition two alignment marks are, and in what direction one or both marks must be moved to approach unique superposition.

The extension of the alignment principle discussed above and illustrated in FIG. 2 to the case of more than two plates, or to the case where beams diffracted in the backward direction are used to achieve superposition, is within the principles of the invention. The use of beams diffracted in the backward direction is illustrated in FIG. 6.

The gap or separation distance between adjacent plates to be aligned according to the method of this invention can be many times larger than the spatial period "d" of the grating pattern (or patterns) in the alignment mark. For example, using a He:Ne laser operating at a wavelength of 6328Å, and alignment marks consisting of grating patterns of 25 $\mu$m spatial period, superposition precision less than 200 nm has been demonstrated at separation distances between facing alignment marks of approximately 100 $\mu$m. For a given radiation wavelength and a given alignment mark structure, however, there may be certain separation distances between facing alignment marks at which the intensities of symmetrically diffracted groups are insensitive or nearly insensitive to lateral displacements of facing alignment marks relative to one another. This fact may be used as part of the practice of this invention to set or adjust the gap, or as a means of controlling, keeping constant, or varying the gap. In practical applications of this invention one would choose an appropriate combination of radiation wavelength, alignment mark structure and gap so that the sensitivity of diffracted group intensities to lateral displacement (i.e., misalignment) is either optimum or acceptable for that application.

Figure 6:
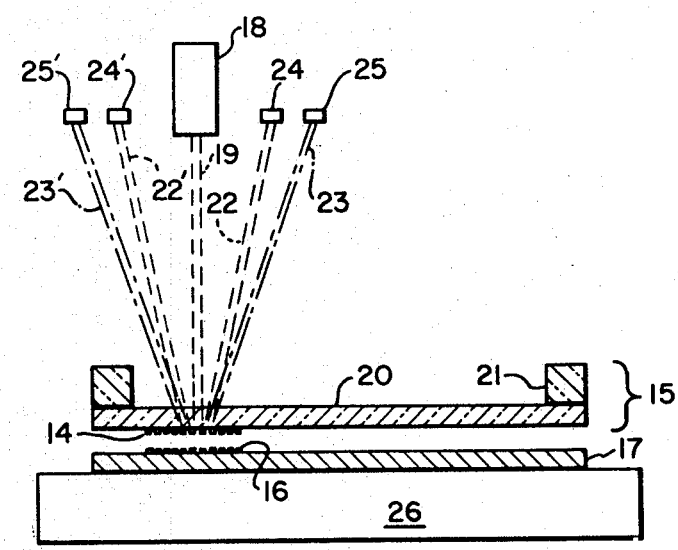
FIG. 6 illustrates a method according to the invention for aligning a plate relative to an opaque substrate.

FIG. 6 illustrates in more detail a method according to this invention for aligning a plate relative to an opaque substrate, more specifically for superimposing the alignment mark 14 of plate 15 over the alignment mark 16 of substrate 17 which may, as indicated, be opaque. Electromagnetic radiation, such as the 6328Å wavelength light from a He:Ne laser is emitted from source 18 (alternatively, any sufficiently collimated radiation can be used. Specifically included are infrared, visible and ultraviolet lasers, and synchrotron sources emitting in the UV and X-ray regions) in the form of a beam 19 which is incident perpendicular to plate 15. Beam 19 is passed through the alignment mark 14 of plate 15. The alignment mark 14 includes a periodic non-blazed grating. Plate 15, as depicted in FIG. 6 is an X-ray lithography mask consisting of a thin membrane 20 supported by a thick support ring 21 (alternatively the plate 15 could be a photomask, a reticle or any other pattern carrying plate). The zero order and other beams diffracted in the forward direction by alignment mark 14 are incident on alignment mark 16 where they are diffracted in the backward direction. As these beams pass back through the alignment mark 14, they are partially diffracted for a third time resulting in the $+$ and $-$ groups indicated. The $+1$ and $-1$ groups are indicated by 22 and 22', the $+2$ and $-2$ groups are indicated by 23 and 23'. The $+1$ and $-1$ groups are shown incident on detectors 24 and 24'; the $+2$ and $-2$ groups are shown incident on detectors 25 and 25'. These detectors measure the intensity of the radiation incident on them.

Figure 7:
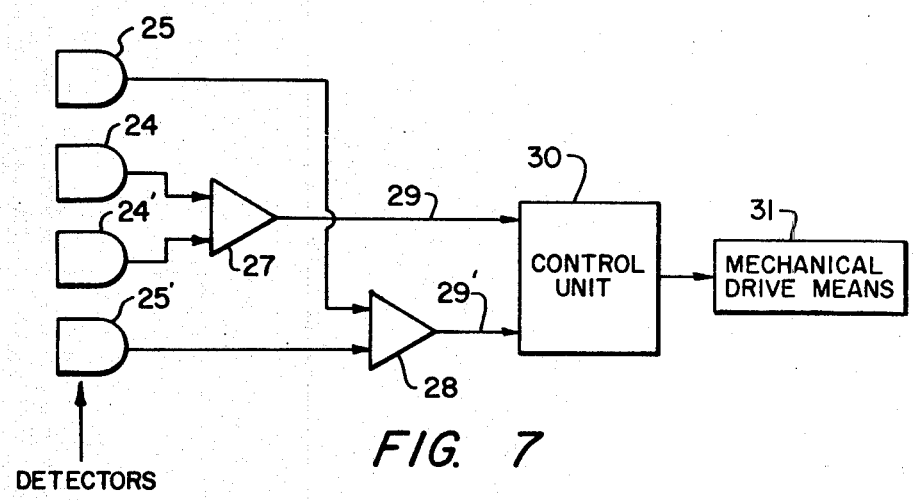
FIG. 7 shows the logical arrangement of a system according to the invention for establishing alignment.

One method of achieving superposition according to the principles of this invention is to connect the outputs of detectors 24 and 24' to a differential amplifier 27 as depicted in FIG. 7 and similarly the outputs of detectors 25 and 25' can be connected to differential amplifier 28. The differential amplifiers generate electrical signals which are the inputs 29 and 29' to a control unit 30. The control unit determines whether all inputs are equal to zero. If all are not zero, the control unit 30 supplies an electrical signal to a mechanical drive means 31, such as a piezoelectric drive, for moving the plate carrier 26 depicted in FIG. 6. Such movement is continued until all inputs to the control unit are zero which corresponds to ΔX=0 and exact superposition. At this point the control unit commands the mechanical means 31 to remain fixed. The specific means for performing these functions are well-known in the control system art and are not described in detail to avoid obscuring the principles of the invention. Alternatively, in place of the control unit, a human operator could monitor the outputs of differential amplifiers 27 and 28 and move the plate carrier 26 until the outputs of all differential amplifiers were nulled, indicating superposition of alignment marks according to one of the principles of this invention.

Figure 8:
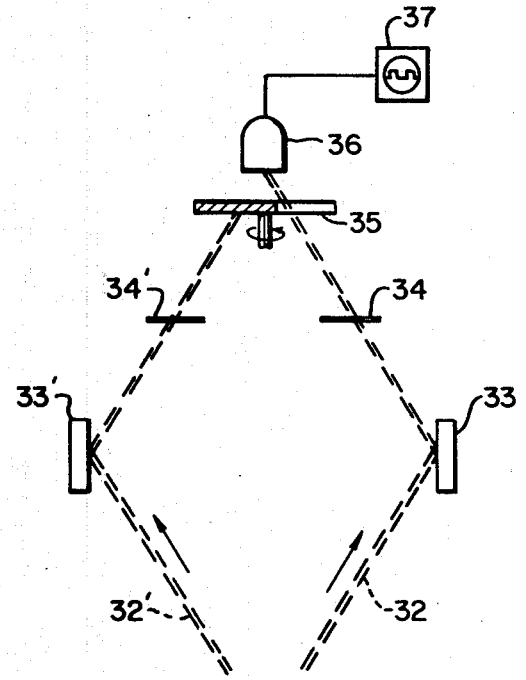
FIG. 8 shows an alternative embodiment of the invention using mirrors or other optical deflecting means and a single detector.

Instead of using a single detector for each + and − group, one could use a single detector for each pair of groups. Mirrors, or other optical components such as prisms, could be put in place of detectors 24, 24', 25 and 25', so as to direct pairs of groups to single detectors, such as depicted in FIG. 8. The + group 32 of a pair is shown reflecting off mirror 33 passing through variable attenuator 34 and through chopper 35 (such as one manufactured by Princeton Applied Research, model 125) onto photodetector 36 (such as Model PIN10, manufactured by United Detector Technology). Likewise, the − member 32' of the pair of groups is reflected off mirror 33' through variable attenuator 34', through chopper 35 onto photodetector 36. The output of the photodetector can be displayed on an oscilloscope 37 as illustrated. By using a single detector, problems such as non-identical response of the two detectors can be avoided. The calibrated attenuators 34 and 34' can be used to compensate for imbalances in the apparatus such as differences in mirror reflectivities.

In many applications of this invention it will be desired to align patterns of one plate relative to patterns on other plates in the two orthogonal directions commonly designated X and Y. It is within the principles of the invention to extend the scheme depicted in FIGS. 2 and 3 to the two dimensional case. For alignment in the X direction at least one grating with lines running substantially perpendicular to the X direction is required on each plate. For alignment in the Y direction, at least one grating with lines running substantially perpendicular to the Y direction is required on each plate. For simultaneous alignment in both X and Y directions, at least two gratings with lines running substantially perpendicular to one another are required on each plate. These two gratings can be incorporated in a single alignment mark forming a grid. Such an alignment mark would provide angular alignment only to less than the angle d/nl radians, where l is the length of grating stripes illuminated by the incident beam, n is the group number and d is the grating period.

Figure 9:
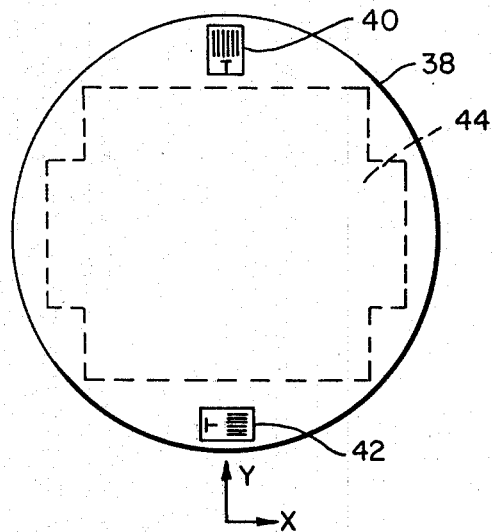
FIGS. 9 and 10 are diagrammatic plan views of plates having mutually perpendicular alignment marks.
Figure 10:
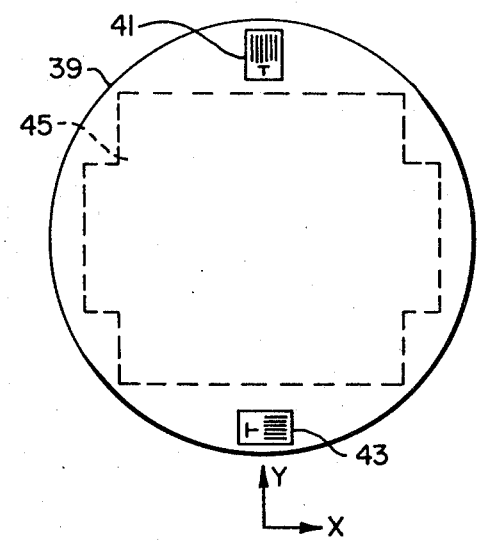

To achieve improver angular alignment as well as alignment in both X and Y the following procedure could be used. FIGS. 9 and 10 are diagrammatic plan views of a first plate 38 and a second plate 39 showing alignment marks 40 and 41 whose grating lines run substantially perpendicular to two other alignment marks 42 and 43 (the T shaped pattern included in the alignment mark patterns indicates that the alignment marks are not invariant to translations of d. A wide variety of other patterns including those having gratings of different periods could also be used. Some such patterns are indicated in FIGS. 4A–4E). There are indicated at 44 and 45 areas for other patterns which may include additional alignment marks. Such areas as indicated by 44 and 45 may be areas set aside for primary patterns as discussed above in connection with the background of the invention. Simultaneous superposition of mark 40 over mark 41 and mark 42 over mark 43 provides X alignment, Y alignment and rotational alignment.

Figure 11:
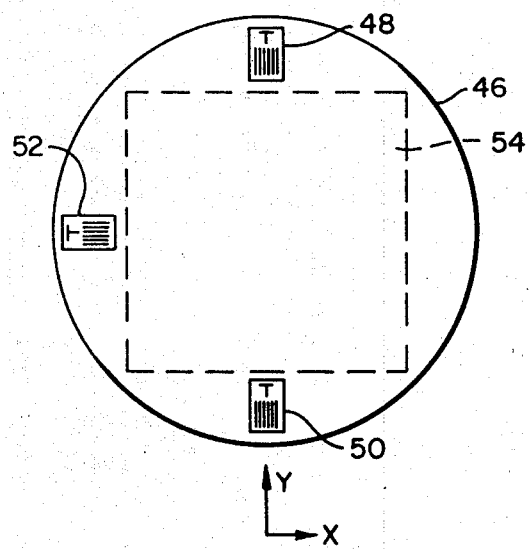
FIGS. 11 and 12 illustrate another embodiment of the invention with each plate having two perpendicular sets of alignment marks for facilitating automatic alignment.
Figure 12:
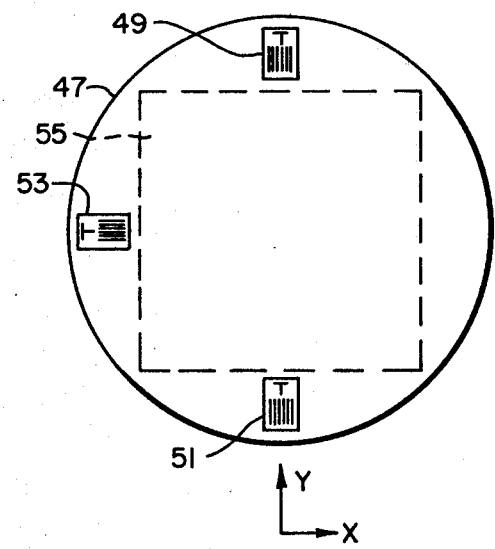

Another procedure which may be easier to automate is indicated in FIGS. 11 and 12 wherein 46 is a first plate and 47 is a second plate. The grating lines of alignment mark 48 run parallel to those of 50 and perpendicular to those of 52. Similarly, on plate 47 the grating lines of alignment mark 49 run parallel to those of alignment mark 51 and perpendicular to those of alignment mark 53. The process of two dimensional alignment consists of first superimposing mark 48 over mark 49 and mark 50 over mark 51. This accomplishes X alignment and rotational alignment to an angle less than δ/L radians, where δ is the error in the X alignment and L is the distance between marks 48 and 50 (identical to the distance between marks 49 and 51). Next, mark 52 is superimposed over mark 53, thereby achieving alignment in Y.

Figure 13:
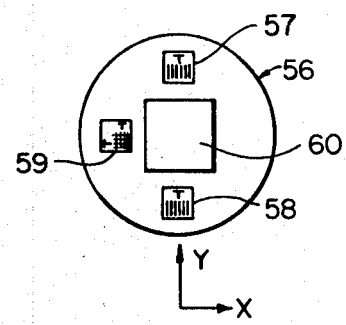
FIGS. 13 and 14 show mask and substrate plates, respectively, having still another arrangement of alignment marks.
Figure 14:
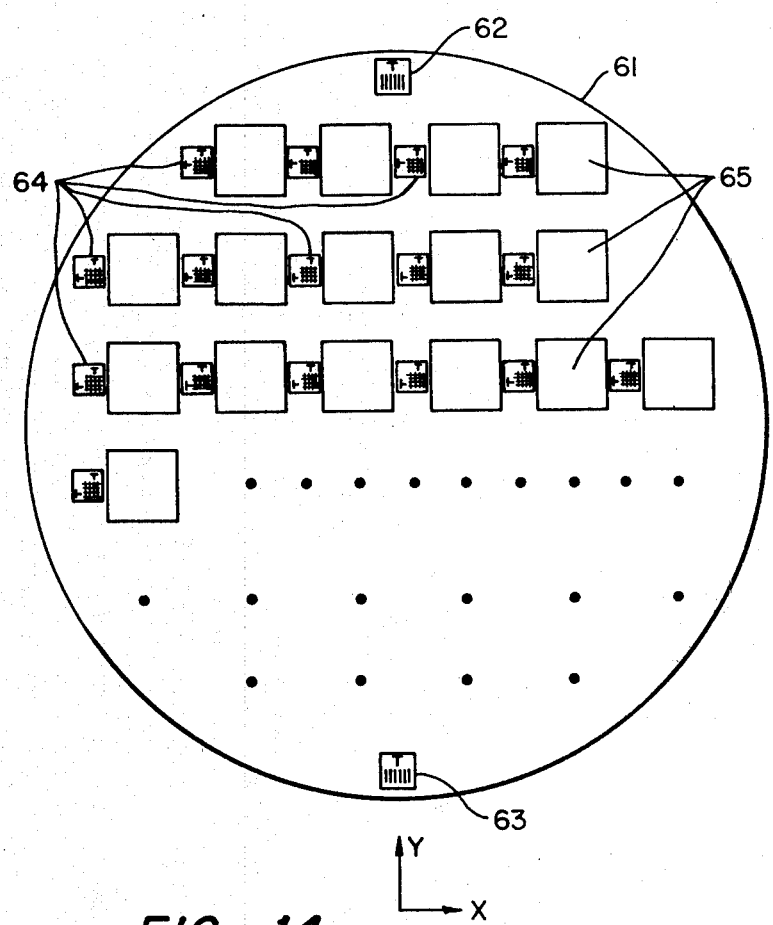

In some cases, lateral distortion occurs in one or both of a pair of plates to be superposed. In such a case, superposition of only two or three alignment marks near the perimeter of the plates does not ensure exact superposition of primary patterns located in the interior portions of the plates. An important example is silicon wafers which undergo distortion as a result of processing in between the separate exposures to a set of masks. A method of overcoming this problem is to locate additional alignment marks at several places throughout the area of the wafer. FIG. 13 indicates a mask plate 56 having alignment marks 57, 58 and 59 and primary pattern 60. Alignment mark 59 includes a grid pattern capable of providing both X and Y alignment. FIG. 14 indicates a substrate plate 61 having alignment marks 62 and 63 at the perimeter, a set of alignment marks 64 distributed throughout the substrate area interior to the perimeter, and areas 65 set aside for primary patterns. In the first step of alignment, mark 57 would be superimposed over mark 62, the mask 56 would then be translated in the Y direction and the misalignment of 58 relative to 63 determined (or instead, the misalignment of 57 relative to 63 could be determined). The wafer 61 or the mask 56 or both would then be rotated in its plane to compensate for the angular misalignment. This process would be repeated until angular orientation was achieved corresponding to mutual parallelism of the gratings of marks 57, 58, 62 and 63. Mask 56 would then be translated in X and Y directions so that mark 59 was superimposed over one of the marks 64. A single beam illuminating the superimposed grids indicated will be diffracted into two sets of groups, one set is embraced by the plane defined by the X and Z axes, the other set is embraced by the YZ plane. After exposure of the primary pattern, the mask would again be moved to superimpose mark 59 over another of the marks 64, and so forth until all of the areas 65 were exposed. It was assumed in the foregoing discussion that only a single angular adjustment was needed. If said assumption is not valid in a given situation the above procedure of sequential realignments could easily be modified to include provision for angular readjustment prior to each exposure.

In order for alignment marks to diffract radiation incident on them they need only to periodically alter its phase or amplitude. Thus, alignment marks for this invention may take a wide variety of forms. For example, they may be simple relief structures in the substrate surface, they may be stripes of transparent material, or they may be stripes of reflective or absorbing material. In the commercially important case of silicon wafers, alignment marks may be simple relief structures or ripple gratings in the silicon or in a layer of silicon dioxide or other material grown on the wafer. This freedom in choosing the form of the alignment mark is an important advantage of this invention. In the case of silicon wafers, for example, it means that alignment marks will not contaminate the wafers or devices fabricated thereon. Neither will the alignment marks necessitate deviations from ordinary wafer processing.

Figure 15:
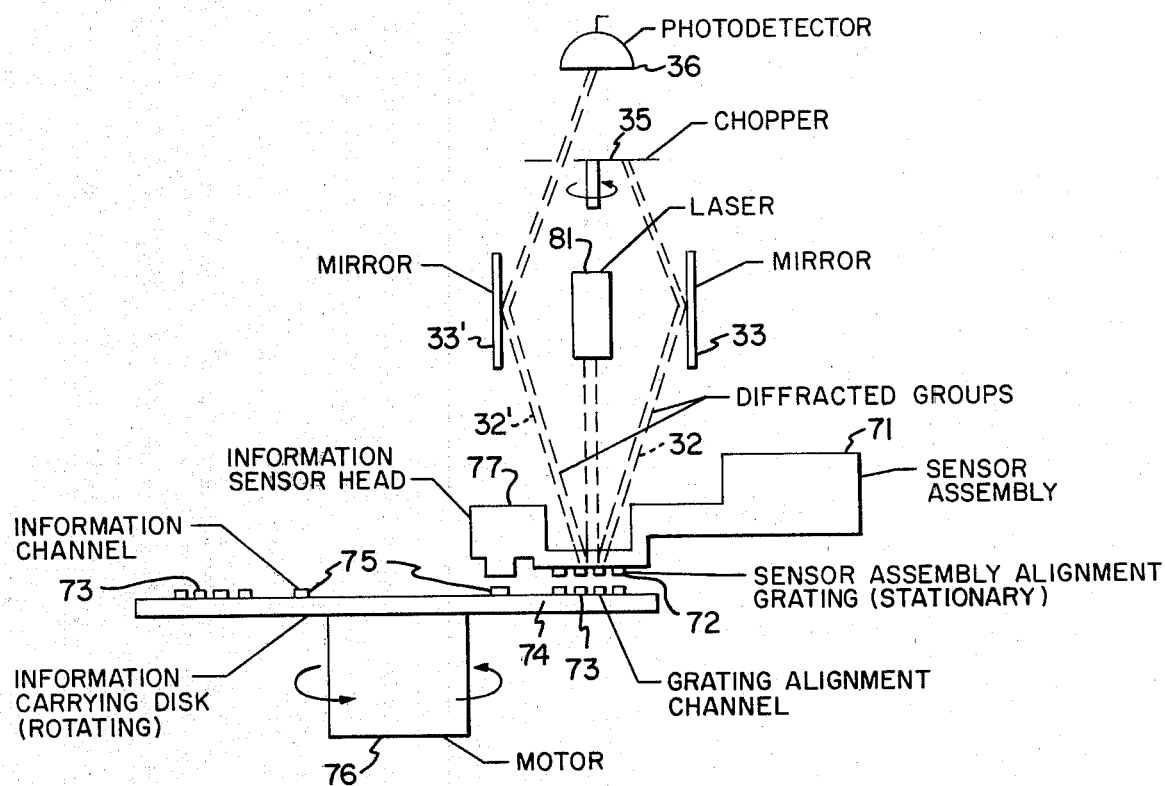
FIGS. 15 and 16 are elevation and plan views, respectively, of a diagrammatic representation of an embodiment of the invention using a rotating information carrying disc.
Figure 16:
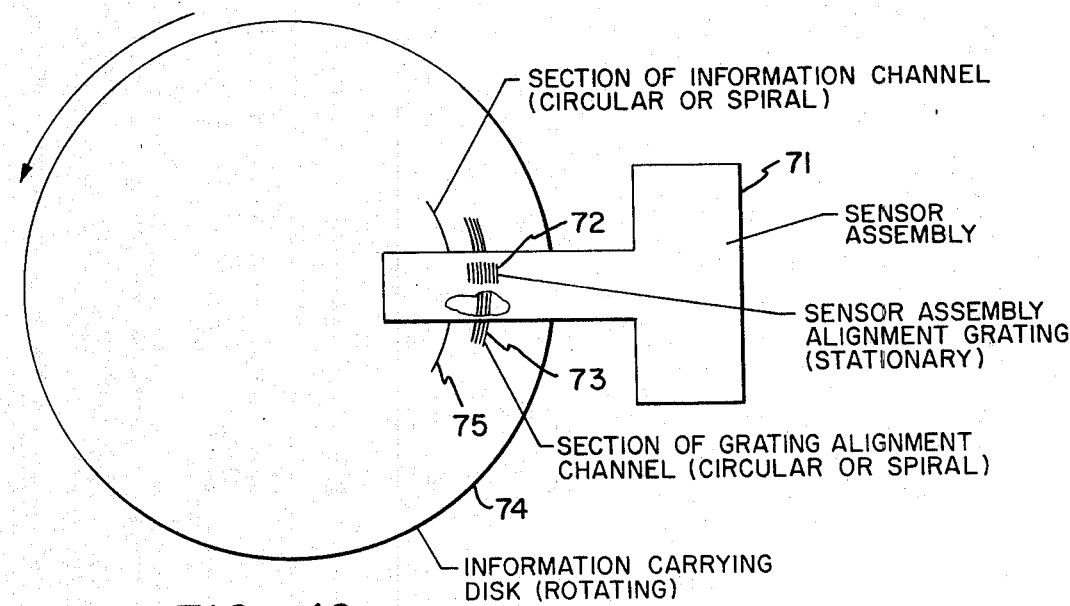

Referring to FIGS. 15 and 16, there are shown elevation and plan views, respectively, of a diagrammatic representation of an embodiment of the invention for establishing alignment between a rotating information carrying disc and an information scanning head for reading and/or writing information. The alignment sensing system is similar to that shown in FIG. 8. This embodiment includes a sensor assembly 71 having a sensor assembly alignment grating 72 opposite a grating alignment channel such as 73 carried on an annular ring of a rotating disc 74 that also includes information channels such as 75. A motor 76 rotates disc 74 as informtion sensor head 77 scans information track 75 to record or read out data on track 75.

Another embodiment would combine the information channel 75 and grating alignment channel 73. This is possible because their functions do not interact. In this embodiment the information sensor head 77 and sensor assembly grating 72 would be positioned at the same radius over the information disk 74.

The system for establishing radial alignment between sensor head 77 and information track 75 is similar to that shown in FIG. 8. A laser 81 illuminates gratings 72 and 73 to provide beams 32 and 32' that are reflected by mirrors 33 and 33', respectively, which alternately illuminate photodetector 36 to produce a signal representative of the instantaneous alignment between sensor head 77 and information channel or track 75.

Figure 17:
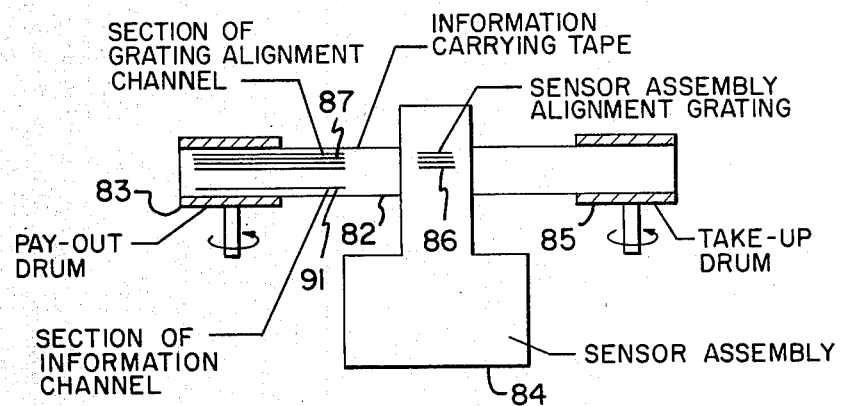
FIGS. 17 and 18 are elevation and plan views, respectively, of a pictorial representation of an embodiment of the invention using moving tape.
Figure 18:
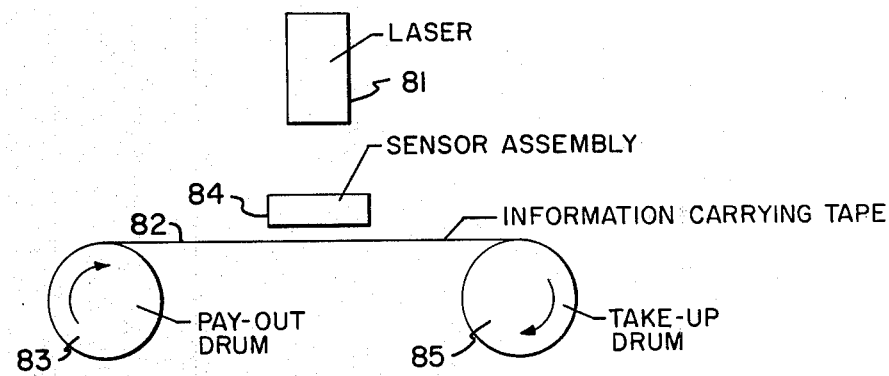

Referring to FIGS. 17 and 18, there are shown elevation and plan views, respectively, of a pictorial representation of still another embodiment of the invention for establishing alignment between an information scanning head and an information carrying tape. Since the sensing system is essentially the same as shown in FIG. 15, most of these elements are not shown in FIG. 17 to better illustrate the relationship between sensor assembly and tape. The system includes an information carrying tape 82 that travels from payout drum 83 under sensor assembly 84 and to take-up drum 85. The sensor assembly 84 includes a sensor assembly alignment gating 86 that is aligned with the grating alignment channel 87 that is parallel to the information channel 91 which is read by sensor head contained in sensor assembly 84. Laser 81 illuminates the grating alignment channel 87 through scanning assembly alignment grating 86 to produce the diffracted groups 32 and 32' (not shown in FIGS. 17 and 18) that are processed as in FIGS. 15 and 8 to produce a control signal as described above in connection with the system of FIGS. 15 and 16 for controlling the position of sensor assembly 84 in a direction transverse to the tape 82 so as to maintain precise alignment between the sensor head 92 and the information bearing channel 91.

Another embodiment would combine the information channel 91 and grating alignment channel 87. This is possible because their functions do not interact.

The embodiments of FIGS. 15-18 are especially advantageous in connection with information storage systems having exceptionally high packing density and requiring precise alignment between a sensing head and information bearing tracks to take advantage of the available packing densities. The invention is useful in connection with optical storage systems, magnetic discs or tapes, and data storage that will require sensing by X-ray or electron beams.

It is evident that those skilled in the art, once given the benefit of the foregoing disclosure, may now make numerous other uses and modifications of, and departures from the specific embodiments described herein without departing from the inventive concepts. For example, a variety of grating structures can be used in the alignment marks and a variety of forms of collimated radiation, including elastic and electromagnetic waves can be used. Consequently, the invention is to be construed as embracing each and every novel feature and novel combination of features present in, or possessed by, the apparatus and techniques herein disclosed and limited solely by the scope and spirit of the appended claims.

What is claimed is:

1. Alignment apparatus comprising:
    first and second relatively movable plates each having diffraction grating means of the same period for diffracting incident wave energy;
    a source of substantially monochromatic wave energy;
    means for illuminating with said wave energy the diffraction grating means on said second plate through the diffraction grating means on said first plate to produce at least one pair of diffracted beams of wave energy;
    detecting means for detecting the relative intensities of said at least one pair of diffracted beams;
    means for carrying an information channel;
    means for scanning said information channel;
    one of said diffraction grating means being supported in fixed relationship to said means for scanning said information channel;
    the other of said diffraction grating means being maintained in fixed relationship with said means for carrying said information channel that is movable relative to said scanning means in a first scanning direction and in a second direction, orthogonal to said first direction;
    whereby said one and said other diffraction grating means may be brought into a predetermined relative position representative of said first and second plates being in predetermined alignment.

2. Alignment apparatus in accordance with claim 1 wherein said means for carrying comprises a rotating disc.

3. Alignment apparatus in accordance with claim 1 wherein said means for carrying comprises a tape.

* * * * *